US007316891B2

(12) United States Patent
Vander Aa et al.

(10) Patent No.: US 7,316,891 B2
(45) Date of Patent: Jan. 8, 2008

(54) METHOD OF DEVELOPING A HEAT-SENSITIVE LITHOGRAPHIC PRINTING PLATE PRECURSOR WITH A GUM SOLUTION

(75) Inventors: Joseph Vander Aa, Rijmenam (BE); Joan Vermeersch, Deinze (BE); Dirk Kokkelenberg, St. Niklaas (BE); Huub Van Aert, Pulderbos (BE)

(73) Assignee: Agfa Graphics NV, Mortsel (BE)

( * ) Notice: Subject to any disclaimer, the term of this patent is extended or adjusted under 35 U.S.C. 154(b) by 511 days.

(21) Appl. No.: 10/379,362

(22) Filed: Mar. 4, 2003

(65) Prior Publication Data

US 2003/0170570 A1    Sep. 11, 2003

Related U.S. Application Data

(60) Provisional application No. 60/366,884, filed on Mar. 22, 2002.

(30) Foreign Application Priority Data

Mar. 6, 2002  (EP) .................................. 02100226

(51) Int. Cl.
 G03F 7/00 (2006.01)
 G03F 7/004 (2006.01)
(52) U.S. Cl. .................. 430/302; 430/270.1; 430/303; 430/309; 430/401; 430/434; 430/448; 430/494; 430/944; 430/945
(58) Field of Classification Search ............. 430/270.1, 430/302, 303, 309, 401, 434, 448, 494, 944, 430/945
See application file for complete search history.

(56) References Cited

U.S. PATENT DOCUMENTS

| 3,475,171 | A |   | 10/1969 | Alles |
|---|---|---|---|---|
| 4,004,924 | A |   | 1/1977 | Vrancken et al. |
| 4,245,031 | A | * | 1/1981 | Chambers ................ 430/288.1 |
| 4,329,422 | A |   | 5/1982 | Langlais |
| 4,350,756 | A |   | 9/1982 | Burch et al. |
| 4,370,406 | A |   | 1/1983 | Jones |
| 4,786,581 | A |   | 11/1988 | Stahlhofen et al. |
| 4,841,040 | A | * | 6/1989 | Just et al. .................... 536/105 |
| 4,873,174 | A |   | 10/1989 | Dhillon et al. |
| 4,912,021 | A |   | 3/1990 | Dhillon et al. |
| 4,959,296 | A |   | 9/1990 | Yoshida |
| 5,049,479 | A |   | 9/1991 | Zertani et al. |
| 5,155,011 | A |   | 10/1992 | Zertani et al. |
| 5,532,116 | A |   | 7/1996 | Suzuki et al. |
| 5,629,354 | A |   | 5/1997 | West et al. |
| 5,837,421 | A |   | 11/1998 | Kanda et al. |
| 5,948,591 | A |   | 9/1999 | Vermeersch et al. |
| 5,948,599 | A |   | 9/1999 | Gardner et al. |
| 5,955,238 | A |   | 9/1999 | Yokoya |
| 5,981,144 | A | * | 11/1999 | Damme et al. ........... 430/271.1 |
| 6,001,536 | A |   | 12/1999 | Vermeersch et al. |
| 6,004,727 | A | * | 12/1999 | Verlinden et al. ............ 430/302 |
| 6,010,824 | A |   | 1/2000 | Komano et al. |
| 6,027,857 | A |   | 2/2000 | Li et al. |
| 6,030,765 | A |   | 2/2000 | Leenders et al. |
| 6,037,098 | A |   | 3/2000 | Aoai et al. |
| 6,071,675 | A |   | 6/2000 | Teng |
| 6,080,523 | A | * | 6/2000 | Vermeersch et al. ...... 430/270.1 |
| 6,096,481 | A |   | 8/2000 | Vermeersch et al. |
| 6,171,735 | B1 |   | 1/2001 | Li et al. |
| 6,197,478 | B1 | * | 3/2001 | Vermeersch et al. ...... 430/272.1 |
| 6,218,076 | B1 |   | 4/2001 | Ogata |
| 6,232,038 | B1 |   | 5/2001 | Takasaki et al. |
| 6,245,481 | B1 |   | 6/2001 | Teng |
| 6,309,792 | B1 | * | 10/2001 | Hauck et al. ............. 430/270.1 |
| 6,358,669 | B1 | * | 3/2002 | Savariar-Hauck et al. ........................ 430/273.1 |
| 6,387,595 | B1 |   | 5/2002 | Teng |
| 6,410,205 | B1 |   | 6/2002 | Leichsenring et al. |
| 6,420,089 | B1 |   | 7/2002 | Baumann et al. |
| 6,482,571 | B1 |   | 11/2002 | Teng |
| 6,534,238 | B1 | * | 3/2003 | Savariar-Hauck et al. ........................ 430/270.1 |
| 6,548,222 | B2 |   | 4/2003 | Teng |
| 6,576,401 | B2 |   | 6/2003 | Teng |
| 6,589,710 | B2 | * | 7/2003 | Christall et al. ............ 430/302 |
| 6,605,407 | B2 | * | 8/2003 | Yu et al. .................. 430/270.1 |
| 6,641,976 | B2 | * | 11/2003 | Vermeersch et al. ...... 430/270.1 |

(Continued)

FOREIGN PATENT DOCUMENTS

| DE | 2 626 473 A1 | 1/1977 |
|---|---|---|
| EP | 222 297 A2 | 5/1987 |
| EP | 0 320 945 A2 | 6/1989 |
| EP | 0 599 510 A | 6/1994 |
| EP | 599510 A2 * | 6/1994 |

(Continued)

OTHER PUBLICATIONS

Search Report for EP 02 10 0226 (Dec. 6, 2002).

(Continued)

Primary Examiner—Amanda C. Walke
(74) Attorney, Agent, or Firm—Keating & Bennett, LLP

(57) ABSTRACT

A method of making a lithographic printing plate is disclosed which comprises the steps of
 providing a lithographic printing plate precursor comprising (i) a support having a hydrophilic surface or which is provided with a hydrophilic layer and (ii) a coating provided thereon which comprises hydrophobic thermoplastic polymer particles;
 exposing the coating to heat, thereby inducing coalescence of the thermoplastic polymer particles at exposed areas of the coating;
 developing the precursor by applying a gum solution to the coating, thereby removing non-exposed areas of the coating from the support.
According to the above method, the plate precursor can be developed and gummed in a single step.

14 Claims, No Drawings

U.S. PATENT DOCUMENTS

| | | | |
|---|---|---|---|
| 6,805,052 B2 | 10/2004 | Aert et al. | |
| 6,861,202 B2 | 3/2005 | Toshimitsu et al. | |
| 6,890,700 B2 | 5/2005 | Tomita et al. | |
| 6,890,702 B2 | 5/2005 | Matsumura | |
| 6,949,327 B2 * | 9/2005 | Zheng et al. | 430/284.1 |
| 6,953,652 B2 * | 10/2005 | Van Damme et al. | 430/271.1 |
| 2002/0068240 A1 | 6/2002 | Teng | |
| 2002/0098447 A1 | 7/2002 | Teng | |
| 2003/0036019 A1 | 2/2003 | Teng | |
| 2003/0124460 A1 | 7/2003 | Munnelly et al. | |
| 2003/0165777 A1 | 9/2003 | Teng | |
| 2003/0170570 A1 | 9/2003 | Vander Aa et al. | |
| 2003/0224259 A1 * | 12/2003 | Verschueren et al. | 430/19 |
| 2004/0013968 A1 | 1/2004 | Teng | |
| 2004/0079246 A1 | 4/2004 | Davis et al. | |
| 2005/0037287 A1 | 2/2005 | Verschueren et al. | |
| 2005/0266349 A1 | 12/2005 | Van Damme et al. | |

FOREIGN PATENT DOCUMENTS

| | | |
|---|---|---|
| EP | 0 770 497 A1 | 5/1997 |
| EP | 0 849 091 A | 6/1998 |
| EP | 931 647 | 7/1999 |
| EP | 1 025 991 A1 | 8/2000 |
| EP | 1 025 992 A1 | 8/2000 |
| EP | 1 075 941 A2 * | 2/2001 |
| EP | 1 079 276 A1 | 2/2001 |
| EP | 1 172 229 | 1/2002 |
| EP | 1 219 416 | 7/2002 |
| EP | 1 241 002 A2 | 9/2002 |
| EP | 1 288 720 A1 | 3/2003 |
| EP | 1 341 040 A1 | 9/2003 |
| EP | 1 342 568 A1 | 9/2003 |
| EP | 1 349 006 A1 | 10/2003 |
| EP | 1 359 008 A1 | 11/2003 |
| EP | 1 366 898 A2 * | 12/2003 |
| EP | 1 369 231 A2 | 12/2003 |
| EP | 1 369 232 A1 | 12/2003 |
| EP | 1 378 794 A1 | 1/2004 |
| EP | 1 513 020 A2 | 3/2005 |
| GB | 1 148 362 | 4/1969 |
| JP | 09171250 | 6/1997 |
| WO | 00/63026 A | 10/2000 |
| WO | 02/04210 A1 | 1/2002 |
| WO | 02/101 469 A1 | 12/2002 |
| WO | 2005111717 A2 | 11/2005 |
| WO | 2006037716 A1 | 4/2006 |
| WO | 2004095141 A1 | 11/2006 |

OTHER PUBLICATIONS

"Chemistry-Free Digital Thermal Plate System: Azura"; AGFA; Agfa brochure; May 6, 2004.

Official communication issued in the corresponding European Patent Application No. EP 04 07 6475; Dec. 1, 2004.

F.R. Mayers; "Management of Change in the Aluminum Printing Industry"; vol. 62; p. 69; 2002.

Official communication issued in the corresponding International Patent Application No. PCT/EP2005/052298; dated Oct. 6, 2005.

Office Action dated Jan. 10, 2006 issued in the U.S. Patent Application No. 11/132,168.

Office Action dated Apr. 20, 2006 issued in the U.S. Patent Application No. 11/132,168.

Office Action dated Dec. 18, 2006 issued in the U.S. Patent Application No. 11/132,168.

M. Vandamme et al.; "Method of Making a Photopolymer Printing Plate"; U.S. Patent Application No. 11/132,168; filed on May 18, 2005.

* cited by examiner

METHOD OF DEVELOPING A HEAT-SENSITIVE LITHOGRAPHIC PRINTING PLATE PRECURSOR WITH A GUM SOLUTION

This application claims the benefit of U.S. Provisional Patent Application No. 60/366,884, filed Mar. 22, 2002, which is hereby incorporated by reference.

FIELD OF THE INVENTION

The present invention relates to a method for making a lithographic printing plate wherein a heat-sensitive lithographic printing plate precursor is developed and gummed in a single step.

BACKGROUND OF THE INVENTION

In lithographic printing, a so-called printing master such as a printing plate is mounted on a cylinder of the printing press. The master carries a lithographic image on its surface and a printed copy is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called "driographic" printing, the lithographic image consists of ink-accepting and ink-abhesive (ink-repelling) areas and during driographic printing, only ink is supplied to the master.

Printing masters are generally obtained by the so-called computer-to-film (CtF) method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master. Since about 1995, the so-called 'computer-to-plate' (CtP) method has gained a lot of interest. This method, also called 'direct-to-plate', bypasses the creation of film because the digital document is transferred directly to a plate precursor by means of a so-called plate-setter.

Especially thermal plates, which are sensitive to heat or infrared light, are widely used in computer-to-plate methods because of their daylight stability. Such thermal materials may be exposed directly to heat, e.g. by means of a thermal head, but preferably comprise a compound that converts absorbed light into heat and are therefore suitable for exposure by lasers, especially infrared laser diodes. The heat, which is generated on image-wise exposure, triggers a (physico-)chemical process, such as ablation, polymerization, insolubilization by cross-linking of a polymer, decomposition, or particle coagulation of a thermoplastic polymer latex, and after optional processing, a lithographic image is obtained. Many thermal plate materials are based on heat-induced ablation. A problem associated with ablative plates is the generation of debris which is difficult to remove and may disturb the printing process or may contaminate the exposure optics of the plate-setter. As a result, such ablative plates require a processing step for removing the debris from the exposed material.

EP-A 770 494 discloses a method wherein an imaging material comprising an image-recording layer of a hydrophilic binder, a compound capable of converting light to heat and hydrophobic thermoplastic polymer particles, is image-wise exposed, thereby inducing coalescence of the polymer particles and converting the exposed areas into an hydrophobic phase which defines the printing areas of the printing master. The press run can be started immediately after exposure without any additional treatment because the layer is developed by interaction with the fountain and ink that are supplied to the cylinder during the press run. During the first runs of the press, the non-exposed areas are removed from the support and thereby define the non-printing areas of the plate. So the wet chemical processing of these materials is 'hidden' to the user and accomplished during the start-up of the printing press. Other prior art documents such as EP-A 770 497 and U.S. Pat. No. 6,001,536 describe the (off-press) development of similar materials with water or an aqueous liquid.

In both CtF and CtP methods, it is customary to treat the developed printing plate with a so-called gum solution. A gum solution is an aqueous liquid which is capable of protecting the plate from scumming or toning, i.e. ink-acceptance at the non-printing areas due to contamination by fingerprints, fats, oils or dust. Often, the gum solution also protects the plate from oxidative contamination or against the occurrence of scratches during handling of the plate, e.g. image correction, storage, or mounting on the plate cylinder of a press. A special type of gum solution, called baking gum, is used for protecting the plate during the baking step. A baking step involves heating of the plate so as to increase the run length during printing.

SUMMARY OF THE INVENTION

From the above, it is clear that a typical plate-making process involves many steps: image-wise exposure, development, gumming and baking. It is therefore an object of the present invention to provide a plate-making process wherein some of these steps can be combined in a single operation. According to the present invention, a heat-sensitive lithographic printing plate precursor which works according to the mechanism of heat-induced particle coalescence of a thermoplastic polymer is developed by means of a gum solution. Specific features for preferred embodiments of the present invention are set out in the dependent claims. Further advantages and embodiments of the present invention will become apparent from the following description.

DETAILED DESCRIPTION OF THE INVENTION

A gum solution is typically an aqueous liquid which comprises one or more surface protective compounds that are capable of protecting the lithographic image of a printing plate against contamination or damaging. Suitable examples of such compounds are film-forming hydrophilic polymers or surfactants. The layer that remains on the plate after treatment with the gum solution preferably comprises between 0.1 and 20 $g/m^2$ of the surface protective compound.

A gum solution is normally supplied as a concentrated solution which is diluted by the end user with water before use. In the present description, all concentrations of compounds present in the gum solution are expressed as percentage by weight (wt. %) relative to the non-diluted gum solution, unless otherwise indicated.

Preferred polymers for use as protective compound in the gum solution are gum arabic, pullulan, cellulose derivatives such as carboxymethylcellulose, carboxyethylcellulose or methylcellulose, (cyclo)dextrin, poly(vinyl alcohol), poly(vinyl pyrrolidone), polysaccharide, homo- and copolymers of acrylic acid, methacrylic acid or acrylamide, a copolymer of vinyl methyl ether and maleic anhydride, a copolymer of vinyl acetate and maleic anhydride or a copolymer of styrene and maleic anhydride. Highly preferred polymers are homo- or copolymers of monomers containing carboxylic, sulfonic or phosphonic groups or the salts thereof, e.g. (meth)acrylic acid, vinyl acetate, styrene sulfonic acid, vinyl sulfonic acid, vinyl phosphonic acid or acrylamidopropane sulfonic acid.

Examples of surfactants for use as surface protective agent include anionic or nonionic surfactants. The gum solution may also comprise one or more of the above hydrophilic polymers as surface protective agent and, in addition, one or more surfactants to improve the surface properties of the coated layer. The surface tension of the gum solution is preferably from 40 to 50 mN/m.

Examples of the anionic surfactant include aliphates, abietates, hydroxyalkanesulfonates, alkanesulfonates, dialkylsulfosuccinates, straight-chain alkylbenzenesulfonates, branched alkylbenzenesulfonates, alkylnaphthalenesulfonates, alkylphenoxypolyoxyethylenepropylsulfonates, salts of polyoxyethylene alkylsulfophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylesters, salts of alkylsulfuric esters, sulfuric esters of polyoxyethylenealkylethers, salts of sulfuric esters of aliphatic monoglycerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrenemaleic anhydride copolymers, partially saponified compounds of olefin-maleic anhydride copolymers, and naphthalenesulfonateformalin condensates. Particularly preferred among these anionic surfactants are dialkylsulfosuccinates, salts of alkylsulfuric esters and alkylnaphthalenesulfonates.

Specific examples of suitable anionic surfactants include sodium dodecylphenoxybenzene disulfonate, the sodium salt of alkylated naphthalenesulfonate, disodium methylenedinaphtalene-disulfonate, sodium dodecyl-benzenesulfonate, sulfonated alkyl-diphenyloxide, ammonium or potassium perfluoroalkylsulfonate and sodium dioctyl-sulfosuccinate.

Suitable examples of the nonionic surfactants include polyoxyethylene alkyl ethers, polyoxyethylene alkyl phenyl ethers, polyoxyethylene polystyryl phenyl ethers, polyoxyethylene polyoxypropylene alkyl ethers, polyoxyethylene polyoxypropylene block polymers, partial esters of glycerinaliphatic acids, partial esters of sorbitanaliphatic acid, partial esters of pentaerythritolaliphatic acid, propyleneglycolmonoaliphatic esters, partial esters of sucrosealiphatic acids, partial esters of polyoxyethylenesorbitanaliphatic acid, partial esters of polyoxyethylenesorbitolaliphatic acids, polyethyleneglycolaliphatic esters, partial esters of poly-glycerinaliphatic acids, polyoxyethylenated castor oils, partial esters of polyoxyethyleneglycerinaliphatic acids, aliphatic diethanolamides, N,N-bis-2-hydroxyalkylamines, polyoxyethylene alkylamines, triethanolaminealiphatic esters, and trialkylamine oxides. Particularly preferred among these nonionic surfactants are polyoxyethylene alkylphenyl ethers and poloxyethylene-polyoxpropylene block polymers. Further, fluorinic and siliconic anionic and nonionic surfactants may be similarly used.

Two or more of the above surfactants may be used in combination. For example, a combination of two or more different anionic surfactants or a combination of an anionic surfactant and a nonionic surfactant may be preferred. The amount of such a surfactant is not specifically limited but is preferably from 0.01 to 20 wt. %.

The gum solution has preferably a pH from 3 to 8, more preferably from 5 to 8. The pH of the gum solution is usually adjusted with a mineral acid, an organic acid or an inorganic salt in an amount of from 0.01 to 2 wt. %. Examples of the mineral acids include nitric acid, sulfuric acid, phosphoric acid and metaphosphoric acid. Especially organic acids are used as pH control is agents and as desensitizing agents. Examples of the organic acids include carboxylic acids, sulfonic acids, phosphonic acids or salts thereof, e.g. succinates, phosphates, phosphonates, sulfates and sulfonates. Specific examples of the organic acid include citric acid, acetic acid, oxalic acid, malonic acid, p-toluenesulfonic acid, tartaric acid, malic acid, lactic acid, levulinic acid, phytic acid and organic phosphonic acid. Examples of the inorganic salt include magnesium nitrate, monobasic sodium phosphate, dibasic sodium phosphate, nickel sulfate, sodium hexametaphosphate and sodium tripolyphosphate. Other inorganic salts can be used as corrosion inhibiting agents, e.g. magnesium sulfate or zinc nitrate. The mineral acid, organic acid or inorganic salt may be used singly or in combination with one or more thereof.

Besides the foregoing components, a wetting agent such as ethylene glycol, propylene glycol, triethylene glycol, butylene glycol, hexylene glycol, diethylene glycol, dipropylene glycol, glycerin, trimethylol propane and diglycerin may also be present in the gum solution. The wetting agent may be used singly or in combination with one or more thereof. In general, the foregoing wetting agent is preferably used in an amount of from 1 to 25 wt. %.

Further, a chelate compound may be present in the gum solution. Calcium ion and other impurities contained in the diluting water can have adverse effects on printing and thus cause the contamination of printed matter. This problem can be eliminated by adding a chelate compound to the diluting water. Preferred examples of such a chelate compound include organic phosphonic acids or phosphonoalkanetricarboxylic acids. Specific examples are potassium or sodium salts of ethylenediaminetetraacetic acid, diethylenetriaminepentaacetic acid, triethylenetetraminehexaacetic acid, hydroxyethylethylenediaminetriacetic acid, nitrilotriacetic acid, 1-hydroxyethane-1,1-diphosphonic acid and aminotri(methylenephosphonic acid). Besides these sodium or potassium salts of these chelating agents, organic amine salts are useful. The preferred amount of such a chelating agent to be added is from 0.001 to 1.0 wt. % relative to the gum solution in diluted form.

Further, an antiseptic and an anti-foaming agent may be present in the gum solution. Examples of such an antiseptic include phenol, derivatives thereof, formalin, imidazole derivatives, sodium dehydroacetate, 4-isothiazoline-3-one derivatives, benzoisothiazoline-3-one, benztriazole derivatives, amidineguanidine derivatives, quaternary ammonium salts, pyridine derivatives, quinoline derivatives, guanidine derivatives, diazine, triazole derivatives, oxazole and oxazine derivatives. The preferred amount of such an antiseptic to be added is such that it can exert a stable effect on bacteria, fungi, yeast or the like. Though depending on the kind of bacteria, fungi and yeast, it is preferably from 0.01 to 4 wt. % relative to the gum solution in diluted form. Further, preferably, two or more antiseptics may be used in combination to exert an aseptic effect on various fungi and bacteria. The anti-foaming agent is preferably silicone antifoaming agents. Among these anti-foaming agents, either an emulsion dispersion type or solubilized type anti-foaming agent may be used. The proper amount of such an anti-foaming agent to be added is from 0.001 to 1.0 wt. % relative to the gum solution in diluted form.

Besides the foregoing components, an ink receptivity agent may be present in the gum solution if desired. Examples of such an ink receptivity agent include turpentine oil, xylene, toluene, low heptane, solvent naphtha, kerosine, mineral spirit, hydrocarbons such as petroleum fraction having a boiling point of about 120° C. to about 250° C., diester phthalates (e.g., dibutyl phthalate, diheptyl phthalate, di-n-octyl phthalate, di(2-ethylhexyl) phthalate, dinonyl phthalate, didecyl phthalate, dilauryl phthalate, butylbenzyl phthalate), aliphatic dibasic esters (e.g., dioctyl adipate, butylglycol adipate, dioctyl azelate, dibutyl sebacate, di(2-ethylhexyl) sebacate dioctyl sebacate), epoxidated triglycerides (e.g., epoxy soyabean oil), ester phosphates (e.g., tricresyl phosphate, trioctyl phosphate, trischloroethyl phosphate) and plasticizers having a solidification point of 15° C. or less and a boiling point of 300° C. or more at one atmospheric pressure such as esters of benzoates (e.g., benzyl benzoate). Examples of other solvents which can be used in combination with these solvents include ketones (e.g., cyclohexanone), halogenated hydrocarbons (e.g., ethylene dichloride), ethylene glycol ethers (e.g., ethylene glycol monomethyl ether, ethylene glycol monophenyl ether, ethylene glycol monobutyl ether), aliphatic acids (e.g., caproic acid, enathic acid, caprylic acid, pelargonic acid, capric acid, undecylic acid, lauric acid, tridecylic acid, myristic acid, pentadecylic acid, palmitic acid, heptadecylic acid, stearic acid, nonadecanic acid, arachic acid, behenic acid, lignoceric acid, cerotic acid, heptacosanoic acid, montanic acid, melissic acid, lacceric acid, isovaleric acid) and unsaturated aliphatic acids (e.g., acrylic acid, crotonic acid, isocrotonic acid, undecyclic acid, oleic acid, elaidic acid, cetoleic acid, erucic acid, butecidic acid, sorbic acid, linoleic acid, linolenic acid, arachidonic acid, propiolic acid, stearolic acid, clupanodonic acid, tariric acid, licanic acid). Preferably, it is an aliphatic acid which is liquid at a temperature of 50° C., more preferably has from 5 to 25 carbon atoms, most preferably has from 8 to 21 carbon atoms. The ink receptivity agent may be used singly or in combination with one or more thereof. The ink receptivity agent is preferably used in an amount of from 0.01 to 10 wt. %, more preferably from 0.05 to 5 wt. %. The foregoing ink receptivity agent may be present as an oil-in-water emulsion or may be solubilized with the aid of a solubilizing agent.

The viscosity of the gum solution can be adjusted to a value of e.g. between 1.7 and 5 cP, by adding viscosity increasing compounds, such as poly(ethylene oxide), e.g. having a molecular weight between $10^5$ and $10^7$. Such compounds can be present in a concentration of 0.01 to 10 g/l.

A baking gum has a similar composition as described above, with the additional preference towards compounds that do not evaporate at the usual bake temperatures. Specific examples of suitable baking gum solutions are described in e.g. EP-A 222 297, EP-A 1 025 992, DE-A 2 626 473 and U.S. Pat. No. 4,786,581.

The lithographic printing plate precursor used in the method of the present invention is negative-working and develops a lithographic image consisting of hydrophobic and hydrophilic areas at the exposed and non-exposed areas respectively. The hydrophilic areas are defined by the support which has a hydrophilic surface or is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel.

A particularly preferred lithographic support is an electrochemically grained and anodized aluminum support. The anodized aluminum support may be treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde It is further evident that one or more of these post treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

According to another embodiment, the support can also be a flexible support, which may be provided with a hydrophilic layer, hereinafter called 'base layer'. The flexible support is e.g. paper, plastic film or aluminum. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 µm and is preferably 1 to 10 µm. More details of preferred embodiments of the base layer can be found in e.g. EP-A 1 025 992.

The coating provided on the support comprises an image-recording layer which contains hydrophobic thermoplastic polymer particles. Specific examples of suitable hydrophobic polymers are e.g. polyethylene, poly(vinyl chloride), poly(methyl (meth)acrylate), poly(ethyl (meth)acrylate), poly(vinylidene chloride), poly(meth)acrylonitrile, poly(vinyl carbazole), polystyrene or copolymers thereof. Polystyrene and poly(meth)acrylonitrile or their derivatives are highly preferred embodiments. According to such preferred embodiments, the thermoplastic polymer comprises at least 50 wt. % of polystyrene, and more preferably at least 60 wt. % of polystyrene. In order to obtain sufficient resistivity towards organic chemicals, such as the hydrocarbons used in plate cleaners, the thermoplastic polymer preferably comprises at least 5 wt. %, more preferably at least 30 wt. % of nitrogen containing monomeric units or of units which correspond to monomers that are characterized by a solubility parameter larger than 20, such as (meth)acrylonitrile. Suitable examples of such nitrogen containing monomeric units are disclosed in European Patent Application no. 01000657, filed on 23, Nov. 2001.

According to the most preferred embodiment, the thermoplastic polymer is a copolymer consisting of styrene and acrylonitrile units in a weight ratio between 1:1 and 5:1 (styrene:acrylonitrile), e.g. in a 2:1 ratio.

The weight average molecular weight of the thermoplastic polymer particles may range from 5,000 to 1,000,000 g/mol. The hydrophobic particles preferably have a number average particle diameter below 200 nm, more preferably between 10 and 100 nm. The amount of hydrophobic thermoplastic polymer particles contained in the image-recording layer is preferably between 20 wt. % and 65 wt. % and more preferably between 25 wt. % and 55 wt. % and most preferably between 30 wt. % and 45 wt. %.

The hydrophobic thermoplastic polymer particles are present as a dispersion in an aqueous coating liquid of the image-recording layer and may be prepared by the methods disclosed in U.S. Pat. No. 3,476,937. Another method especially suitable for preparing an aqueous dispersion of the thermoplastic polymer particles comprises:

dissolving the hydrophobic thermoplastic polymer in an organic water immiscible solvent,
dispersing the thus obtained solution in water or in an aqueous medium and
removing the organic solvent by evaporation.

The image-recording layer preferably comprises a hydrophilic binder, e.g. homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The image-recording layer may also contain other ingredients such as additional binders, surfactants, colorants, development inhibitors or accelerators, and especially one or more compounds that are capable of converting infrared light into heat. Particularly useful light-to-heat converting compounds are for example infrared dyes, carbon black, metal carbides, borides, nitrides, carbonitrides, bronze-structured oxides, and conductive polymer dispersions such as polypyrrole, polyaniline or polythiophene dispersions. The colorants are preferably dyes or pigments which provide a visible image after processing.

The coating may also contain one or more additional layer(s), adjacent to the image-recording layer. Such additional layer can e.g. be an adhesion-improving layer between the image-recording layer and the support; or a light-absorbing layer comprising one or more of the above compounds that are capable of converting infrared light into heat; or a covering layer which is removed during processing with the gum solution.

The printing plate precursors used in the present invention are exposed to heat or to infrared light, e.g. by means of a thermal head, LEDs or an infrared laser. Preferably, a laser emitting near infrared light having a wavelength in the range from about 700 to about 1500 nm is used, e.g. a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10-25 µm), the scan speed and the resolution of the exposure apparatus (i.e. the number of addressable pixels per unit of linear distance, often expressed in dots per inch or dpi; typical value: 1000-4000 dpi). Two types of laser-exposure apparatuses are commonly used: internal (ITD) and external drum (XTD) plate-setters. ITD plate-setters for thermal plates are typically characterized by a very high scan speed up to 500 m/sec and may require a laser power of several Watts. XTD plate-setters for thermal plates having a typical laser power from about 200 mW to about 1 W operate at a lower scan speed, e.g. from 0.1 to 10 m/sec.

Due to the heat generated during the exposure step, the hydrophobic thermoplastic polymer particles fuse or coagulate so as to form a hydrophobic phase which corresponds to the printing areas of the printing plate. Coagulation may result from heat-induced coalescence, softening or melting of the thermoplastic polymer particles. There is no specific upper limit to the coagulation temperature of the thermoplastic hydrophobic polymer particles, however the temperature should be sufficiently below the decomposition temperature of the polymer particles. Preferably the coagulation temperature is at least 10° C. below the temperature at which the decomposition of the polymer particles occurs. The coagulation temperature is preferably higher than 50° C., more preferably above 100° C.

In the development step, the non-exposed areas of the image-recording layer are removed by supplying a gum or baking gum solution without essentially removing the exposed areas, i.e. without affecting the exposed areas to an extent that renders the ink-acceptance of the exposed areas inacceptable. The development by supplying a gum or baking gum may be combined with mechanical rubbing, e.g. by a rotating brush. The gum or baking gum solution can be applied to the plate e.g. by rubbing in with an impregnated pad, by dipping, (spin-)coating, spraying, pouring-on, either by hand or in an automatic processing apparatus. After applying the baking gum solution, the plate can be dried before baking or is dried during the baking process itself. The baking process can proceed at a temperature above the coagulation temperature of the thermoplastic polymer particles, e.g. between 100° C. and 230° C. for a period of 5 to 40 minutes. For example the exposed and developed plates can be baked at a temperature of 230° C. for 5 minutes, at a temperature of 150° C. for 10 minutes or at a temperature of 120° C. for 30 minutes. Baking can be done in conventional hot air ovens or by irradiation with lamps emitting in the infrared or ultraviolet spectrum.

EXAMPLES

Comparative Example

Onto an electrochemically grained and anodized aluminum substrate, an image-recording layer was coated from an aqueous coating solution at a wet thickness of 30 g/m². After drying, the image-recording layer consisted of 600 mg/m² of polystyrene particles having an average particle size of 70 nm, stabilized with an anionic wetting agent, 60 mg/m² of infrared absorbing dye I, 120 mg/m² of polyacrylic acid (Glascol D15 from Allied Colloids, molecular weight 2.7× $10^7$ g/mole) and 80 mg/m² of blue contrast dye II.

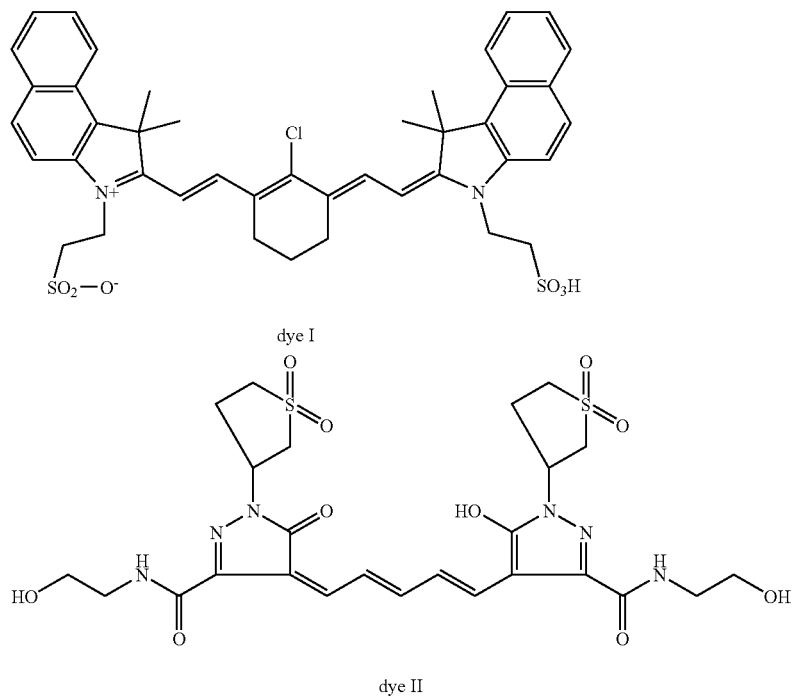

dye I dye II

The plate precursor thus obtained was exposed with a Creo Trendsetter (plate-setter available from CreoScitex, Burnaby, Canada), operating at 330 mJ/cm² and 150 rpm. The material was then developed with water in a HWP450 processing apparatus, available from Agfa-Gevaert N.V., Mortsel, Belgium. After development, the plate was baked in an oven at a temperature of 270° C. during 2 minutes.

The plate was then mounted on a GTO46 printing press, available from Heidelberger Druckmaschinen AG, Heidelberg, Germany. Printing with K&E800 ink and 4% of Combifix XL and 10% of isopropanol as a fountain solution resulted in a high level of toning (ink acceptance in non-image areas) on the printed sheet. The same test was repeated without baking the plate, which produced slight toning and some ink buildup on the blanket.

Example 1

The same material as described above was processed in a HWP450 processing apparatus with a gum solution containing 77 ml/l DOWFAX 3B2 surfactant solution (available from Dow Chemical), 10 g/l of citric acid (1 aqua) and 33 g/l of tri-sodium citrate (2 aqua). The pH of the gum solution was 5.0 and the surface tension was 45 mN/m. A baking step as described above was also carried out.

The same print test as described above produced high quality prints, free of toning. A similar result, without ink buildup on the blanket, was obtained with the non-baked material.

Example 2

The same material as described above was prepared with the proviso that the thermoplastic polymer particles consisted of styrene and acrylonitrile in a 60:40 molar ratio and had an average diameter of 65 nm. Using the same exposure, development, baking and printing steps as in Example 1, a run length of 100,000 printed copies, free of toning, was obtained. A similar result, without ink buildup on the blanket, was obtained with the non-baked material.

Example 3

Plate precursors were prepared and exposed as in Example 2 and then developed using an HWP450 apparatus with the following solutions:
(i) aqueous buffer consisting of 400 ml of 1 molar $KH_2PO_4$ and 600 ml of 1 molar $Na_2HPO_4$ (pH=7.0).
(ii) aqueous buffer consisting of 467 ml 0.1 molar NaOH and 500 ml of 1 molar mono-potassium citrate, diluted to one litre (pH=5.0).
(iii) an aqueous solution of 7 wt. % of sodium silicate
(iv) developer EN232, available from Agfa-Gevaert, Mortsel, Belgium, which is a typical developer for conventional, UV-sensitive, negative plates.
(v) an aqueous gum solution containing 8 ml/l of DOWFAX 3B2, specified above, 1 g/l of citric acid (1 aqua) and 3 g/l of tri-sodium citrate (2 aqua), having a pH of 5.25 and a surface tension of 41 mN/m.

Baking and printing was carried out as described above. The plates produced by developing method (i), (ii), (iii) and (iv) produced poor prints with significant toning, whereas plate (v) produced high quality prints, free of toning.

We claim:
1. A method of making a lithographic printing plate comprising the steps of
  (a) providing a lithographic printing plate precursor comprising (i) a support having a hydrophilic surface or which is provided with a hydrophilic layer and (ii) a coating provided thereon which comprises hydrophobic thermoplastic polymer particles, wherein the thermoplastic polymer is a copolymer comprising at least 5 wt. % of a nitrogen-containing monomer, and a compound which is capable of converting infrared light into heat;
(b) exposing the coating to infrared light, thereby inducing coalescence of the thermoplastic polymer particles at exposed areas of the coating; and
(c) developing the precursor by applying a gum solution to the coating, thereby removing non-exposed areas of the coating from the support.

2. A method according to claim 1, wherein the copolymer further comprises styrene.

3. A method according to claim 1 wherein the gum solution is a baking gum solution and the method comprises an additional baking step by heating the developed plate precursor at a temperature of at least 6000° C.

4. A method according to claim 1 wherein the gum solution comprises a hydrophilic film-forming polymer.

5. A method according to claim 4, wherein the hydrophilic film-forming polymer is a polymer containing sulfonic groups.

6. A method according to claim 1 wherein the gum solution comprises an organic acid or a salt thereof.

7. A method according to claim 1 wherein the gum solution has a surface tension lower than 50 mN/m and a pH between 5 and 8.

8. A method according to claim 1 wherein the gum solution comprises a surfactant.

9. A method according to claim 4 wherein the gum solution comprises a surfactant.

10. A method according to claim 1, wherein the coating further comprises a contrast dye or pigment which provides a visible image after development.

11. A method according to claim 1, wherein lithographic printing plate precursor is not mounted on a printing press during step (c).

12. A method according to claim 1, wherein the copolymer further comprises at least 50 wt. % of styrene.

13. A method according to claim 1, wherein the copolymer comprises at least 30 wt. % of the nitrogen-containing monomer.

14. A method according to claim 1, wherein the gum solution comprises a surface protective compound, and after the developing step a layer comprising 0.05 to 20 $g/m^2$ of the surface protective compound remains on the lithographic printing plate.

* * * * *